(12) United States Patent
Luk

(10) Patent No.: US 7,235,993 B2
(45) Date of Patent: Jun. 26, 2007

(54) HIGH SPEED ELECTROMECHANICALLY DRIVEN TEST AHEAD

(76) Inventor: Fong Luk, 216 Sweet Rd., Alameda, CA (US) 94502

( * ) Notice: Subject to any disclaimer, the term of this patent is extended or adjusted under 35 U.S.C. 154(b) by 0 days.

(21) Appl. No.: 10/887,965

(22) Filed: Jul. 8, 2004

(65) Prior Publication Data

US 2005/0007138 A1 Jan. 13, 2005

(51) Int. Cl.
*G01R 31/02* (2006.01)
(52) U.S. Cl. .................................... 324/761
(58) Field of Classification Search ............. None
See application file for complete search history.

(56) References Cited

U.S. PATENT DOCUMENTS

| 6,089,124 | A | * | 7/2000 | Murphy | 81/3.39 |
| 6,696,845 | B2 | * | 2/2004 | Kamata | 324/719 |
| 6,703,825 | B1 | * | 3/2004 | Creek et al. | 324/158.1 |
| 6,836,136 | B2 | * | 12/2004 | Aghaeepour | 324/765 |

* cited by examiner

*Primary Examiner*—Ha Tran Nguyen
*Assistant Examiner*—Trung Q. Nguyen
(74) *Attorney, Agent, or Firm*—Bo-In Lin

(57) ABSTRACT

A method for testing an integrated circuit (IC) that includes a step of mechanically turning on off an electrical connection to a test pin disposed on an electronic test head. The method further includes a step of rotating a driving rod to engage a switching wheel or other similar means for turning on-off of an electrical connection.

9 Claims, 1 Drawing Sheet

HIGH SPEED ELECTROMECHANICALLY DRIVEN TEST AHEAD

BACKGROUND OF THE INVENTION

1. Field of the Invention

This invention relates generally to the method and system of testing the integrated circuits (ICs) and printed circuit board (PCB). More particularly, this invention relates to an electromechanically driven test head with miniaturized physical size with pin electronics in the test head such that the signal path from the pin electronics to the device under test (DUT) is less than ¼ wavelength of the highest frequency component of the driving signal.

2. Description of the Prior Art

As the integrated circuits (ICs) and electronic components supported on a printed circuit board (PCB) become more complicate with higher level of integration and increasingly faster operational speed, the test heads implemented in conventional techniques of IC and PCB circuit testing are challenged by many technical difficulties. One particular difficulty is the large size of the test heads due to the use of relay to switch off and isolate the high speed pin electronics from the low speed parametric and analog test circuitry so that the high speed signal from the pin electronics will not be effected during high speed testing. The physical size and the parasitic capacitance of the relays thus become the major obstacle to the miniaturization of the test head.

The difficulty becomes even more pronounced now due to the increase of operational speed and pin count of an IC test system. In the conventional the IC test system design, the pin electronic signal driving and receiving path to the device under test is required to be a 50 ohm transmission line with matching termination impedance to avoid a problem of signal reflection when the length of the drive path exceeds ¼ wavelength of the driving and receiving signal. Due to the large size of the relays used in the conventional test head, the transmission line requirement for the IC test system's pin electronic presents a very difficult task for IC test system test head design and down grade the tester performance especially for DUT which has no transmission line driving capability In order to reduce the cost of IC testing operations and to increase the performance of the IC test systems there are ever-increased demand to miniaturize the test head to eliminate the transmission line requirement.

Therefore, a demand still exists in the art of IC testing to provide a new configuration and method to reduce the size of the test head such that the above-mentioned difficulties can be resolved.

SUMMARY OF THE PRESENT INVENTION

It is therefore an object of the present invention to provide a new test head with new configuration and method of turning on and off the electrical connections to the test pins IC testing technique and system configuration to overcome the aforementioned difficulties encountered in the prior art.

Specifically, it is an object of the present invention to provide a new IC test head by replacing the electrical relays of conventional test head with electromechanical switches to miniaturize the test head including the pin electronics in the test head such that the signal path from the pin electronics to the device under test (DUT) is less than ¼ wavelength of the highest frequency component of the driving signal.

Another object of the present invention is to provide a new IC test head by using electromechanical switches to miniaturize the test head wherein the electromechanical switches are implemented with commercially available switches for reducing the manufacture cost of test head.

Another object of the present invention is to provide a new IC test head by using electromechanical switches to miniaturize the test head wherein the electromechanical switches are implemented with miniaturized rotational rods and rotational wheels that have simplified structures for reducing the time and costs of test head manufacture.

Briefly, in a preferred embodiment, the present invention comprises an IC testing system. The integrated circuit (IC) testing system is for testing a device under test (DUT) IC. The IC testing system includes a test head that includes a plurality of test pins wherein each of the test pins is connected to a mechanical on-off switch to mechanically turn on and off an electrical connection to each of the test pins. This invention further discloses a method for testing an electronic device that includes a step of mechanically turning on off an electrical connection to a test pin disposed on an electronic test head. In another preferred embodiment, the test head further includes a plurality of rotational rods for transferring a mechanical movement to turn on and off the mechanical switches.

These and other objects and advantages of the present invention will no doubt become obvious to those of ordinary skill in the art after having read the following detailed description of the preferred embodiment, which is illustrated in the various drawing figures.

DETAILED DESCRIPTION OF THE PREFERRED EMBODIMENT

Figure 1A:
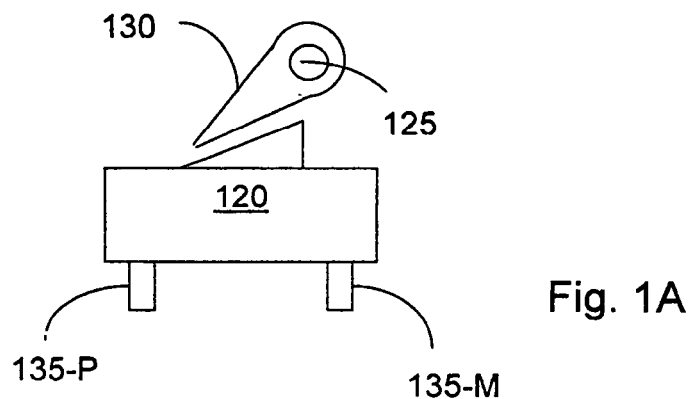
FIGS. 1A, 1B and 1C are a side cross sectional view, a top view and a circuit diagram for illustrating the electrical mechanical switches of this invention.
Figure 1B:
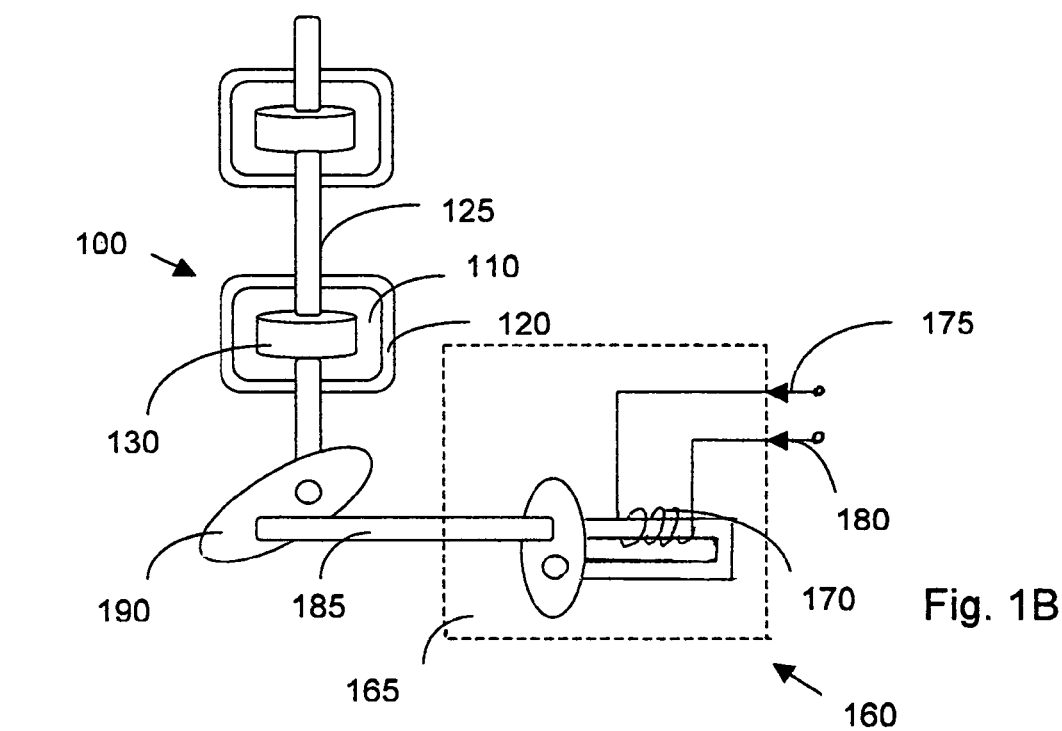
Figure 1C:
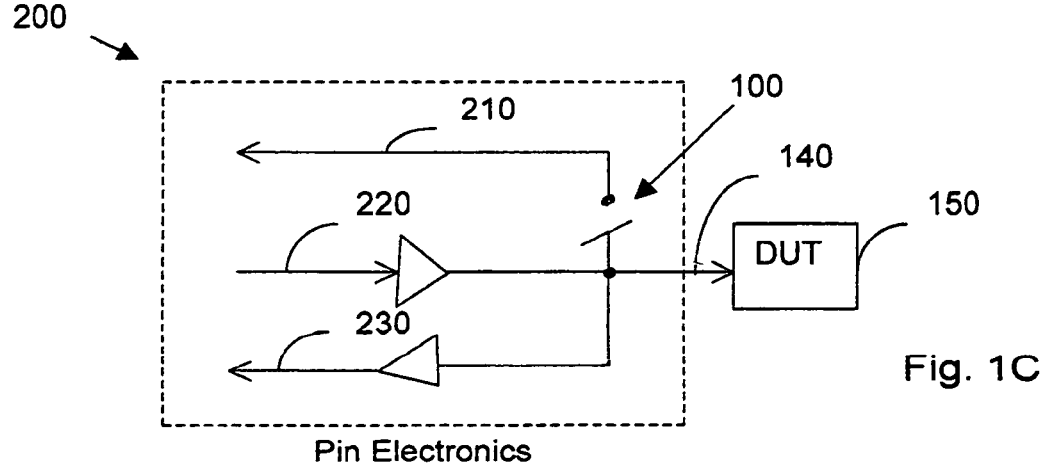

FIGS. 1A, 1B and 1c are a side cross sectional view, a top view and a circuit diagram respectively for illustrating the electrical mechanical switches of this invention. The electrical mechanical switch 100 includes a switch button 110 supported on a switch body 120. The electrical mechanical switch 100 further includes an on-off switching activation mechanism to activate an on-off switching action. The on-off switching activation mechanism as shown in FIGS. 1A and 1B includes a rotational rod 125 for rotating an on-off switching wheel 130 to engage and push the on-off switch button 110 to an on or off position. Each on-off switch includes two contact terminals 135-p and 135-n for electrically connecting or disconnecting between the analog measurement/driver line and () the test pin 140 which is in turn connected to the device under test (DUT) 150. The rotational rod 125 is driven by rotational driver that may be a driving solenoid 160 with a solenoid coil 170 as that shown in FIG. 1B or the rotational driver may be a step motor or other types of driver devices. The driving solenoid 160 with the solenoid coil 170 as shown includes an electric magnet 165 surrounding a coil connected to an electrical current input terminal 175 and an output terminal 180 to pull and push the driving rod 185 and rotate the rotational rod 125 through a linkage lever plate 190. By controlling the electric current of the solenoid, a rotational action of the rotational rod is activated that in turn rotates the pushing wheel 130 to push the switch button 110 to turn on or off the electric switch 120 for each testing pin 140.

A test controller (not shown) controls the solenoid driver 160 to rotate the rod 125 to switch on and off the switch 100 for connecting or disconnecting 210 to the test pin 140 through the pin electronics 200 as that shown in FIG. 1C. The pin electronics further includes an analog measurement and drive line 210 controlled by the test controller for driving/measuring analog signal to/from the DUT 150 via 140 The test pin electronics further includes data driver 220 and receiver 230 for respectively providing high-speed test data to and reading high-speed data from DUT 150 via 140.

According to above descriptions, this invention implements a very simple miniature electrically controlled mechanical switch to replace the conventionally used relay. Since mechanical switch is very simple in construction in compare with the relay, it can be built into a very small size with very small parasitic capacitance. Currently available on the market, there are switches 100 as shown in FIGS. 1A and 1B having a size of 1.0 to 1.5 millimeter in width and about 2.5 millimeters in length and height. By using the miniaturized switches, this invention enable the use of an electromechanically driven test head having a miniaturized physical size with pin electronics in the test head. With this miniaturized test head, the signal path from the pin electronics to the device under test (DUT) can be reduced to less than ¼ wavelength of the highest frequency component of the driving signal. To electrically activate the mechanical switch, a mechanical linkage, such as a rod etc, connects one or multiple of the switch with an electrical mechanical device such as a solenoid or a servomechanism etc. Since one electrical mechanical device can activate multiple switches and can be physically located away from the critical location which is between the pin electronics and the DUT and the switch can be very small in size, the path length between the pin electronics and DUT can be reduced to under 7 cm by using on the shelf common parts or even much less length by using custom design parts. This will enable the test head to operate with high frequency signal component up to GHZ range with very small power consumption and requirement of impedance matching thus enable accurate testing o DUT outputs, which do no have driving capability of transmission line and at the same time ease the design of test head PCB layout and DUT board layout.

The embodiment shown in FIGS. 1A to 1C is only one example. Different kinds of mechanism and switches can be implemented to connect/disconnect the electrical signal to a test pin. Therefore, this invention discloses a test system that includes a plurality of test pins wherein each of the test pins is connected to a mechanical on-off switch to mechanically turn on and off an electrical connection to each of the test pins. This invention further discloses a method for testing an electronic device that includes a step of mechanically turning on off an electrical connection to a test pin disposed on an electronic test head.

According to above descriptions, this invention discloses an integrated circuit (IC) testing system that includes a test head having at least a test pin connected to a mechanically activated switch to turn on and off an electrical connection to the test pin. In a preferred embodiment, the switch further includes a push-button for mechanically pushing to an on and an off positions. In another preferred embodiment, the testing system further includes a switching means for mechanically engage and turning on and off the switch. In another preferred embodiment, the switching means further includes a driving means for driving the switching means to switch on and off. In another preferred embodiment, the switching means further includes a push-button for pushing to an on or off positions. In another preferred embodiment, the switching means further includes a driving means for engaging and pushing the push-button for pushing to an on or off positions. In another preferred embodiment, the switching means further includes driving wheel for engaging and pushing the push-button for pushing to an on or off positions. In another preferred embodiment, the switching means further includes driving rod connected to the driving wheel for engaging and pushing the push-button for pushing to an on or off positions. In another preferred embodiment, the testing system further includes a controlling means for controlling and mechanically turning on and off the switching means. In another preferred embodiment, the testing system a controlling means for controlling and mechanically rotating the driving rod for turning on and off the switching means.

This invention further discloses a method for testing an integrated circuit (IC) that includes a step of mechanically turning on off an electrical connection to a test pin disposed on an electronic test head. In a preferred embodiment, the method further includes a step of rotating a driving rod to engage a switching wheel for pushing an on-off button of the electrical connection.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

I claim:

1. An integrated circuit (IC) testing system comprising:
   a test head having a pin electronics for driving and transmitting-receiving measurement signals to and from at least a test pin connected to a mechanical switch to turn on and off an electrical connection to said test pin for testing a device under test (DUT) by applying a mechanical force on said mechanical switch whereby said pin electronics is directly connected to said test pin; and
   said test head further includes a signal path connected from said pin electronics to said test pin wherein said signal path is approximately one-fourth (¼) wavelength of a highest frequency or less of a driving signal for driving said IC testing system.

2. The IC testing system of claim 1 wherein:
   said mechanical switch further includes a push-button for mechanically pushing to an on and an off positions for performing a test of said DUT.

3. The IC testing system of claim 1 wherein:
   said test head having a size of about 1.0 to 1.5 millimeter in width and less than 2.5 millimeters in length and height.

4. The IC testing system of claim 1 further comprising:
   an electromechanical mechanism to apply said mechanical force on said mechanical switch to turn on and off said mechanical switch.

5. The IC testing system of claim 1 wherein:
   said mechanical switch is a commercially available mechanical switch whereby a manufacturing cost of said test head is reduced.

6. The IC testing system of claim 1 further comprising:
   an electromechanical mechanism comprising a miniaturized rotational rod driving a miniaturized rotational wheel to apply said mechanical force on said mechanical switch to turn on and off said mechanical switch.

7. An integrated circuit (IC) testing system comprising:
a test head having a pin electronics for driving and transmitting-receiving measurement signals to and from at least a test pin connected to a mechanical switch to turn on and off an electrical connection to said test pin for testing a device under test (DUT) by applying a mechanical force on said mechanical switch whereby said pin electronics is directly connected to said test pin;
an electromechanical mechanism to apply said mechanical force on said mechanical switch to turn on and off said mechanical switch;
a driving circuit for driving said electromechanical mechanism wherein said driving circuit is disposed at a distance away from said electromechanical mechanism included in said test head whereby said test head is disposed near a device under test (DUT) without interferences from said driving circuit.

8. The IC testing system of claim 7 further includes:
a test controller for controlling a electromechanical mechanism for applying said mechanical force on said mechanical switch to turn on and off said mechanical switch.

9. The IC testing system of claim 7 wherein:
said test pin electronics controlled by said mechanical switch for sending signal to and receiving signal from said test pin in testing said DUT when said mechanical switch is turned on.

* * * * *